United States Patent
Reimer et al.

(10) Patent No.: US 7,153,088 B2
(45) Date of Patent: Dec. 26, 2006

(54) METHOD AND APPARATUS FOR TRANSFERRING A SEMICONDUCTOR SUBSTRATE

(75) Inventors: Peter Reimer, Los Altos, CA (US); Jayesh Patel, Fremont, CA (US)

(73) Assignee: Applied Materials, Inc., Santa Clara, CA (US)

(*) Notice: Subject to any disclaimer, the term of this patent is extended or adjusted under 35 U.S.C. 154(b) by 0 days.

(21) Appl. No.: 10/855,033

(22) Filed: May 27, 2004

(65) Prior Publication Data

US 2004/0219001 A1   Nov. 4, 2004

Related U.S. Application Data

(62) Division of application No. 09/882,394, filed on Jun. 13, 2001, now Pat. No. 6,752,585.

(51) Int. Cl.
B65G 49/07   (2006.01)

(52) U.S. Cl. ............... 414/783; 414/217; 414/936

(58) Field of Classification Search ........... 414/217, 414/217.1, 757, 729, 783, 752.1, 935, 936, 414/805, 804; 294/106
See application file for complete search history.

(56) References Cited

U.S. PATENT DOCUMENTS

| 4,836,733 A | 6/1989 | Hertel et al. |
| 4,944,650 A | 7/1990 | Matsumoto |
| 5,069,269 A | 12/1991 | Reuter et al. |
| 5,308,222 A | 5/1994 | Bacchi et al. |
| 5,364,222 A | 11/1994 | Akimoto et al. |
| 5,556,147 A | 9/1996 | Somekh et al. |
| 5,955,858 A | 9/1999 | Kroeker et al. |
| 6,002,840 A | 12/1999 | Hofmeister |
| 6,085,125 A | 7/2000 | Genov |
| 6,102,164 A | 8/2000 | McClintock et al. |
| 6,109,677 A | 8/2000 | Anthony |
| 6,113,165 A | 9/2000 | Wen et al. |
| 6,160,338 A | 12/2000 | Ono |
| 6,162,008 A | 12/2000 | Perkins et al. |
| 6,313,596 B1 | 11/2001 | Wyka et al. |
| 6,322,312 B1 | 11/2001 | Sundar |
| 6,357,996 B1* | 3/2002 | Bacchi et al. ............ 414/754 |
| 6,752,442 B1* | 6/2004 | McNurlin et al. .......... 294/106 |

FOREIGN PATENT DOCUMENTS

GB   2133757   8/1984

* cited by examiner

*Primary Examiner*—Kathy Matecki
*Assistant Examiner*—Charles A. Fox
(74) *Attorney, Agent, or Firm*—Patterson & Sheridan, LLP

(57) ABSTRACT

A method and apparatus for transferring a substrate is provided. In one embodiment, an apparatus for transferring a substrate includes at least one end effector. A disk is rotatably coupled to the end effector. The disk is adapted to rotate the substrate relative to the end effector. The end effector may additionally include a sensor coupled thereto. The sensor is adapted to detect an indicia of orientation of the substrate supported by the end effector. In another embodiment, a method for transferring a substrate includes rotating the substrate disposed on an end effector and detecting an indicia of orientation of the substrate.

3 Claims, 6 Drawing Sheets

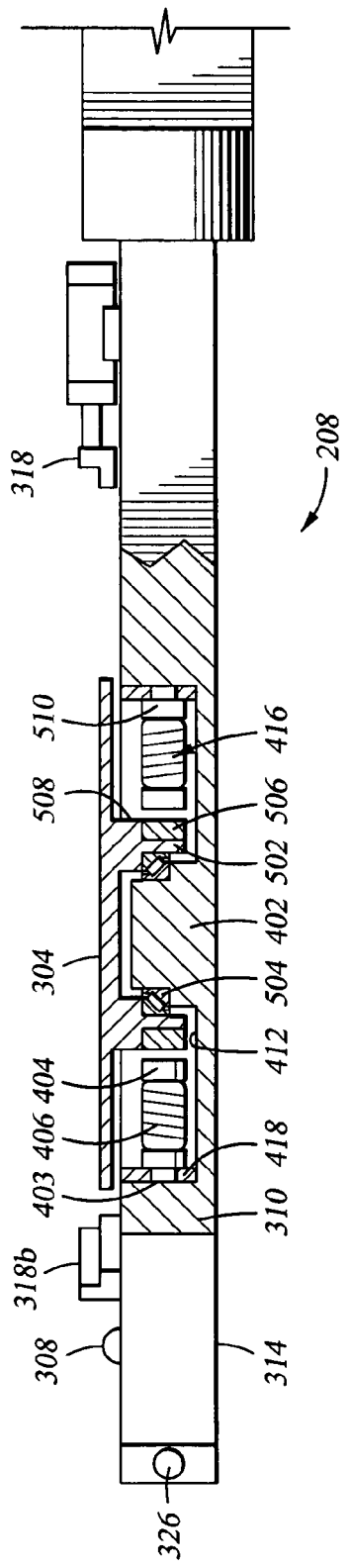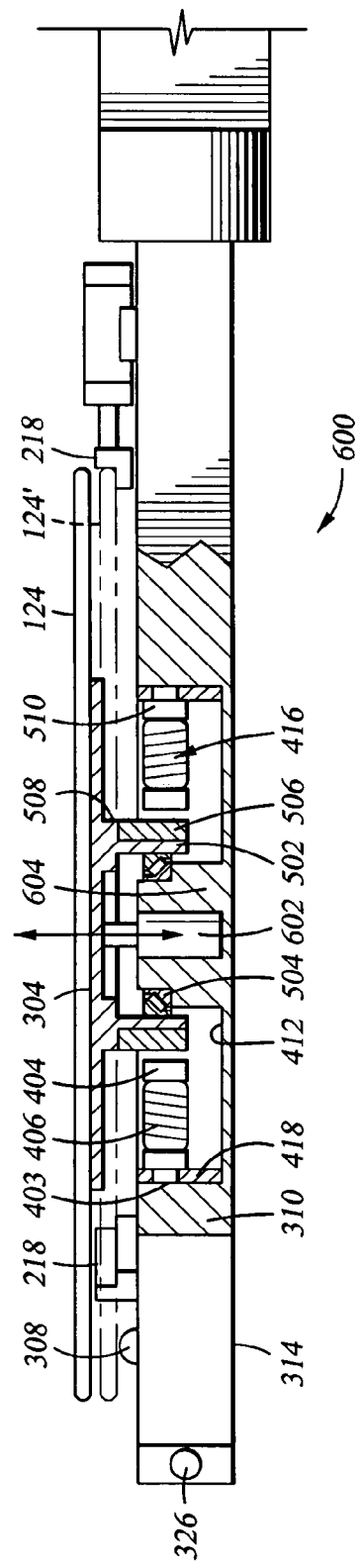

METHOD AND APPARATUS FOR TRANSFERRING A SEMICONDUCTOR SUBSTRATE

CROSS-REFERENCE TO RELATED APPLICATIONS

This application is a divisional of U.S. patent application Ser. No. 09/882,394, filed Jun. 13, 2001, now U.S. Pat. No. 6,752,585, which is herein incorporated by reference in its entirety.

BACKGROUND OF THE DISCLOSURE

1. Field of the Invention

The embodiments of the present invention generally relate to a method and apparatus for transferring a semiconductor substrate.

2. Background of Invention

Semiconductor substrate processing is typically performed by subjecting a substrate to a plurality of sequential processes to create devices, conductors and insulators on the substrate. These processes are generally performed in a processing chamber configured to perform a single step of the production process. In order to efficiently complete the entire sequence of processing steps, a number of processing chambers are typically coupled to a central transfer chamber that houses a robot to facilitate transfer of the substrate between the processing chambers. A semiconductor processing platform having this configuration is generally known as a cluster tool, examples of which are the family of CENTURA® and ENDURA® processing platforms available from Applied Materials, Inc. of Santa Clara, Calif.

Generally, a cluster tool consists of a central transfer chamber having a robot disposed therein. The transfer chamber is typically surrounded by one or more processing chambers, at least one load lock chamber and sometimes a dedicated orientation chamber. The processing chambers are generally utilized to process the substrate, for example, performing various processing steps such as etching, physical vapor deposition, chemical vapor deposition, ion implantation, lithography and the like. Processed and unprocessed substrates are housed in a substrate storage cassette disposed in a factory interface coupled to the load lock chamber. The load lock chamber is isolated from the factory interface and the transfer chamber by slit valves. Substrates enter the transfer chamber from the substrate storage cassettes one at a time through the load lock. The substrate is first positioned in the load lock after the substrate is removed from the cassette. The load lock is then sealed and pumped down to match the operating environment of the substrate transfer chamber. The slit valve between the load lock and transfer chamber is then opened, allowing the substrate transfer robot to access the substrates disposed in the substrate storage cassette. In this fashion, substrates may be transferred into and out of the transfer chamber without having to repeatedly re-establish transfer chamber vacuum levels after each substrate passes through the load lock.

Some processes such as etching and ion implantation require that the substrate have a particular orientation. Typically, substrates include an indicia, such as a notch or a flat on their perimeters in a pre-defined location, that is typically indicative of the orientation of the substrate. This notch is used as a reference point when orientation of the substrate is required.

Typically, orientation of the substrate occurs in the orientation chamber. The orientation chamber generally includes a platform for rotating the substrate and a sensor for detecting the notch or flat on the substrate's perimeter. For example, the platform disposed in the orientator supports the substrate. A shaft is coupled between the platform and a stepper or servo motor to controllably rotate the substrate. A light source is positioned in the orientator near the edge of the substrate and is directed across the substrate's edge to a sensor. The light source is normally blocked by the substrate's perimeter as the perimeter rotates. As the indicia (e.g., the notch or flat) rotates to a position between the light source and sensor, the light beam passes therethrough and impinges on the sensor. The sensor, in response to the impingement of the light beam, indicates the position of the notch, which accordingly, is indicative of the angular orientation of the substrate. Once the position of the notch is determined, the motor is able to rotate the platform and places the notch in a pre-determined angular position that can be referenced throughout the cluster tool and associated chambers.

Although the use of a dedicated orientation chamber coupled to the cluster tool has traditionally provided a robust process for determining the orientation of a substrate, the demand in the semiconductor industry for reduced cost of tool ownership and increased substrate throughput has made the use of a dedicated orientation chamber undesirable. For example, a dedicated orientation chamber increases the cluster tool hardware and software cost. Moreover, the orientation chamber may utilize a position on the cluster tool that could be allocated to an additional process chamber. Additionally, the use of a dedicated orientation chamber requires a time expenditure that is not directly related to processing. For example, time is spent transferring the substrate into the orientation chamber, clearing the robot arm from the orientation chamber, spinning (i.e., orientating) the substrate and retrieving the substrate. This time is significant as the orientation process takes about six to fourteen seconds to execute.

Therefore, there is a need for an improved method and apparatus for transferring a substrate.

SUMMARY OF INVENTION

One aspect of the present invention generally provides an apparatus for transferring a substrate. In one embodiment, an apparatus for transferring a substrate is provided that includes at least one end effector. A disk is rotatably coupled to the end effector. The disk is adapted to support the substrate while rotating the substrate relative to the end effector.

In another embodiment, an apparatus for transferring a substrate includes an end effector that has a sensor coupled thereto. The sensor is adapted to detect an indicia of orientation of the substrate supported by the end effector.

In another embodiment, an apparatus for transferring a substrate includes a chamber that has a robot disposed therein. An end effector having a disk rotatably disposed thereon is coupled to the robot. At least one sensor is disposed on the end effector and is adapted to detect an indicia of orientation of the substrate as the substrate is rotated on the disk.

In another aspect, a method for transferring a substrate is provided. In one embodiment, a method for transferring a substrate includes rotating the substrate disposed on an end effector and detecting an indicia of orientation of the substrate.

In another embodiment, a method for transferring a substrate includes supporting the substrate on an end effector of a robot and rotating to substrate relative to the end effector.

BRIEF DESCRIPTION OF DRAWINGS

The teachings of the present invention can readily be understood by considering the following detailed description in conjunction with the accompanying drawings in which:

FIG. 5 depicts a sectional view of the end effector of FIG. 3;

FIG. 6 depicts a sectional view of another embodiment of an end effector; and

To facilitate understanding, identical reference numerals have been used, wherever possible, to designate identical elements that are common to the figures.

DETAILED DESCRIPTION OF INVENTION

Figure 1:
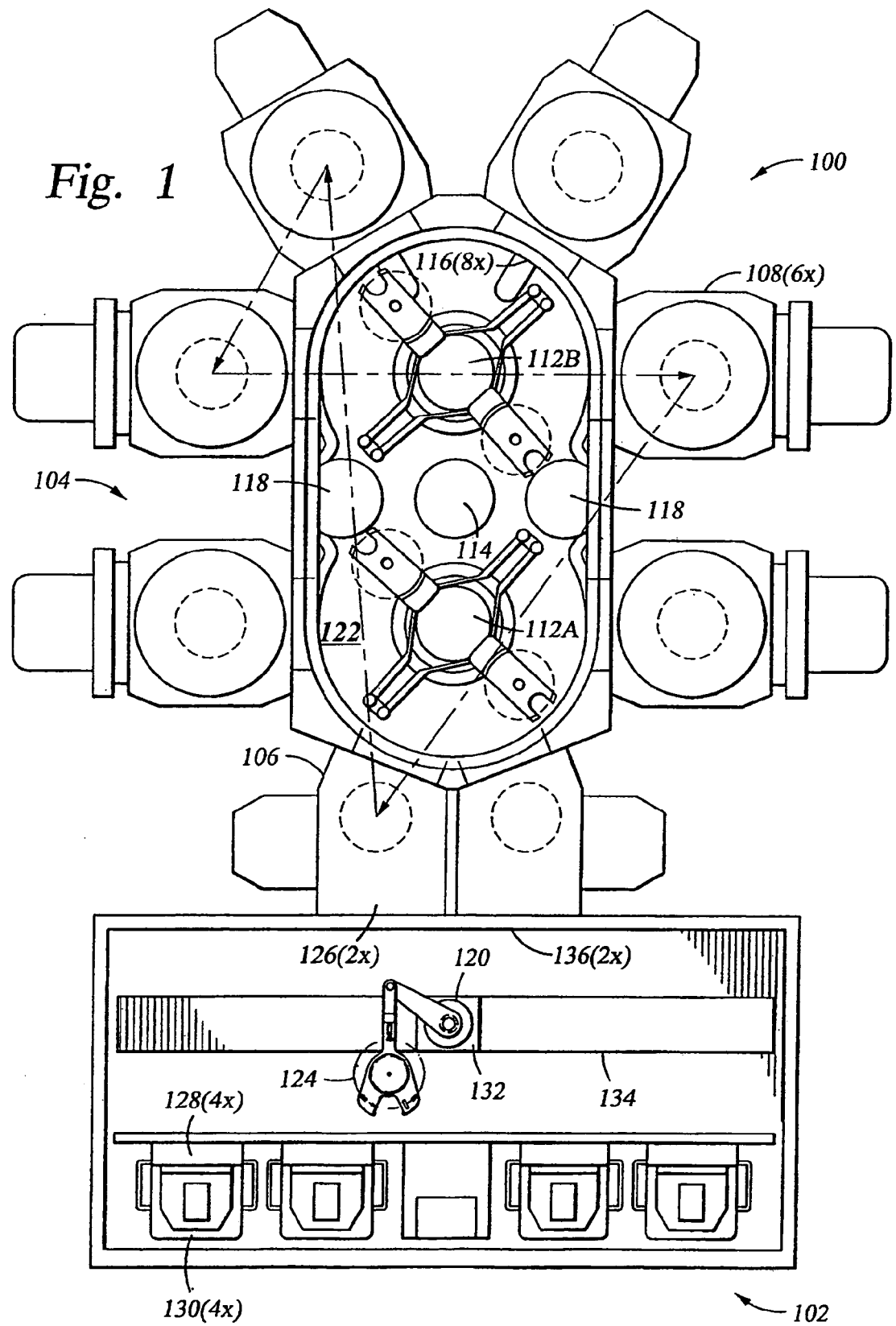
FIG. 1 depicts an exemplary processing system having one embodiment of a substrate transfer mechanism.

FIG. 1 depicts a processing system 100 having one embodiment of a substrate transfer mechanism 120 of the present invention disposed therein. The exemplary processing system 100 additionally includes a factory interface 102, a transfer chamber 104, a least one load lock chamber 106 and a plurality of process chambers 108. One example of a processing system that may be adapted to benefit from the invention is an ENDURA® processing platform, available from Applied Materials, Inc., of Santa Clara, Calif. Although the substrate transfer mechanism 120 is described disposed in the exemplary processing system 100, the description is one of illustration and, accordingly, the substrate transfer mechanism 120 has utility wherever substrate orientation is desired.

The transfer chamber 104 is generally fabricated from a single piece of material such as aluminum. The chamber 104 defines an evacuable interior 122 through which substrates 124 are transferred between the process chambers 108 coupled to the exterior of the chamber 104. A pumping system (not shown) is coupled to the chamber 104 through a pumping port 114 disposed on the chamber's floor to maintain vacuum within the chamber 104. In one embodiment, the pumping system includes a roughing pump coupled in tandem to a turbomolecular or cryogenic pump.

The process chambers 108 are typically bolted to the exterior of the transfer chamber 104. Examples of process chambers 108 that may be utilized are etching chambers, physical vapor deposition chambers, chemical vapor deposition chambers, ion implantation chambers, lithography chambers and the like. Different process chambers 108 may be coupled to the transfer chamber 104 to provide a processing sequence necessary to form a predefined structure or feature upon the substrate's surface. A slit valve 116 is disposed between each process chamber 108 and the transfer chamber 104 to maintain isolation between the environments of the chambers 108, 104 except during transfer of the substrate 124 therebetween.

The load lock chambers 106 (two are shown) are generally coupled between the factory interface 102 and the transfer chamber 104. The load lock chambers 106 are generally used to facilitate transfer of the substrates 124 between the vacuum environment of the interior 122 of the transfer chamber 104 and the environment of the factory interface 102 which is typically held at or near atmospheric pressure. Each load lock chamber 106 is isolated from the interior 122 of the transfer chamber 104 by one of the slit valves 116. Each load lock chamber 106 additionally includes a door 126 disposed between the chamber 106 and the factory interface 102. The door 126 may be opened to allow the substrate transfer mechanism 120 transfer the substrate 124 into the load lock chamber 106. After the substrate transfer mechanism 120 is removed from the load lock chamber 106, the door 126 is closed to isolate the load lock 106. Once the atmosphere within the load lock 106 is substantially equal to that of the transfer chamber 104, the slit valve 116 is opened and the substrate 124 is retrieved into the interior 122 of the transfer chamber 104. Transfer of the substrate 124 from the transfer chamber 104 to the load lock 106 is performed similarly in the reverse order.

A first transfer robot 112A and a second transfer robot 112B are disposed in the interior 122 of the transfer chamber 104 to facilitate transfer of substrates between the process chambers 108. The robots 112A, 112B may be of the dual or single blade variety. The robots 112A, 112B typically have a "frog-leg" linkage that is commonly used to transfer substrates in vacuum environments. The first robot 112A is generally disposed in an end of the transfer chamber 104 adjacent the load locks 106. The second robot 112B is disposed in an opposite end of the transfer chamber 104 such that each robot 112A, 112B services the adjacent process chambers 108. One or more transfer platforms 118 are generally provided in the interior 122 of the chamber 104 to facilitate substrate transfer between robots 112A, 112B. For example, a substrate retrieved from one of the load locks 106 by the first robot 112A is set down on one of the platforms 118. After the first robot 112A is cleared from the platform 118 supporting the substrate 124, the second robot 112B retrieves the substrate from the platform 118. The second robot 112B may then transfer the substrate to one of the process chambers 108 serviced by the second robot 108 at that end of the transfer chamber 104.

To facilitate process control of the system 100, a controller (not shown) comprising a central processing unit (CPU), support circuits and memory, is coupled to the system 100. The CPU may be one of any form of computer processor that can be used in an industrial setting for controlling various drives and pressures. The memory is coupled to the CPU. The memory, or computer-readable medium, may be one or more of readily available memory such as random access memory (RAM), read only memory (ROM), floppy disk, hard disk, or any other form of digital storage, local or remote. The support circuits are coupled to the CPU for supporting the processor in a conventional manner. These circuits may include cache, power supplies, clock circuits, input/output circuitry, subsystems, and the like.

The factory interface 102 generally houses the substrate transfer mechanism 120. The factory interface 102 generally includes a plurality of bays 128 on the side opposite the transfer chamber 104. The bays 128 are configured to accept a substrate storage cassette 130. Opposite the bays 128 are ports 136 that coupled the factory interface 102 to the load lock chambers 106. The substrate transfer mechanism 120 is typically coupled to a guide 132 that is movably disposed on a rail 134. An actuator (not shown) is coupled between the factory interface 102 and the guide 132 so that the guide 132 and substrate transfer mechanism 120 may be controllably positioned along the rail 134. Thus, the substrate transfer mechanism 120 may be positioned proximate any of the cassettes 130 or the load locks 106 to facilitate transfer of the substrate 124 therebetween. An example of one factory interface that may be adapted to benefit from the invention is described in U.S. patent application Ser. No. 09/161,970, filed Sep. 28, 1998 by Kroeker, which is hereby incorporated by reference in its entirety.

Figure 2:
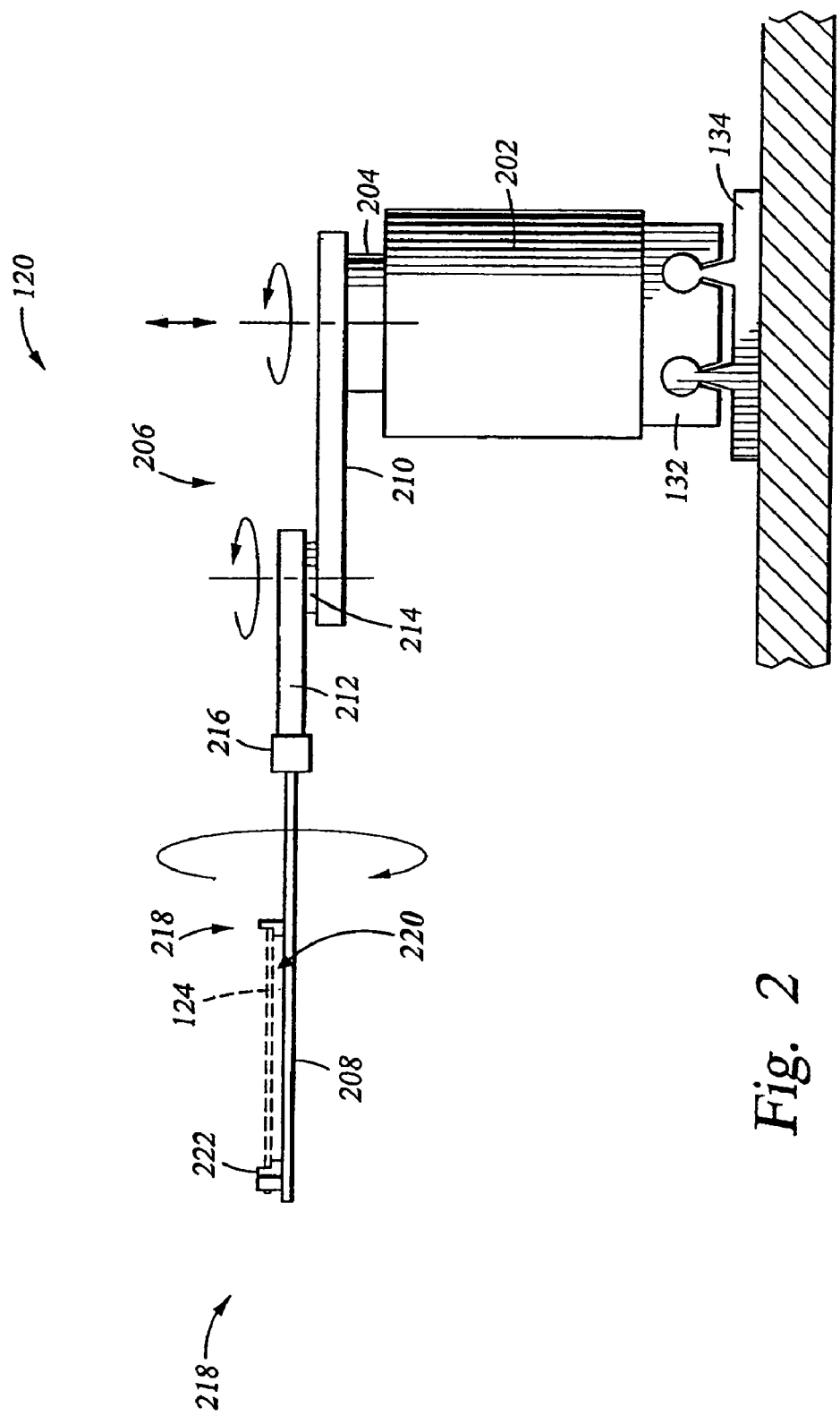
FIG. 2 depicts an elevation of the substrate transfer mechanism of FIG. 1.

FIG. 2 depicts one embodiment of the substrate transfer mechanism 120. The substrate transfer mechanism 120 generally includes a body 202, a shaft 204, a robot arm 206 and an end effector 208. The body 202 generally houses the robot's motor. The shaft 204 extends from the body 202 and is rigidly coupled to the robot arm 206. The shaft 204 may controllably rotate, extend and retract into the body 202 as directed by the controller. The arm 206 includes a first strut 210 and a second strut 212 that are pivotally coupled at an elbow 214. The first strut 210 is rigidly connected to the shaft 204 opposite the elbow 214. A wrist 216 couples the second strut 212 to the end effector 208. The wrist 216 is generally rigid but may optionally pivot or include a rotary actuator. An example of a transfer mechanism that may be adapted to benefit from the invention is described in U.S. patent application Ser. No. 09/272,658, filed Mar. 18, 1999 by Sundar, which is hereby incorporated by reference in its entirety.

The end effector 208 of the substrate transfer mechanism 120 generally retains and supports the substrate during transfer between locations. The end effector 208 generally includes a plurality of seats 218 disposed thereon. Each seat 218 is typically fabricated from a polymeric material to minimize particle generation and substrate scratching which could occurs when the substrate is in contact with the seats 218. Each seat 218 typically includes a base 220 and a lip 222. The base 220 is generally parallel to the end effector 208 and supports the bottom of the substrate. The lip 222 projects from the base 220 and is typically perpendicular thereto. The seats 218 are generally disposed on the end effector 208 such that the lips 222 bound the perimeter of the substrate when seated on the seats 218. In one embodiment, the lip 222 is curved to substantially equal the radius of the substrate. As such, the lips 222 prevent the substrate 124 from sliding off the bases 220 of the seats 218 as the end effector 208 is moved by the substrate transfer mechanism 120.

Figure 3:
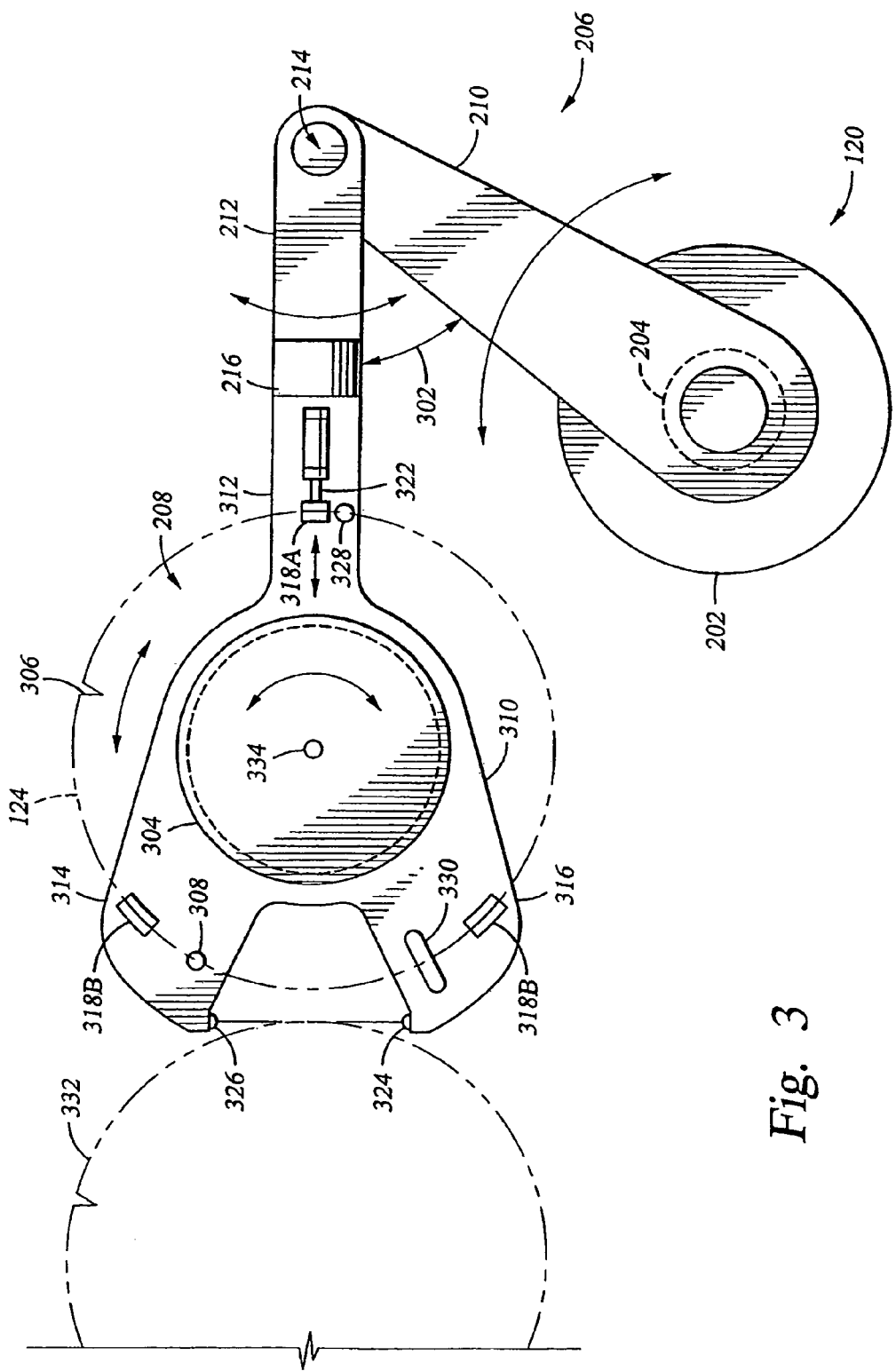
FIG. 3 depicts a plan view of one embodiment of an end effector.

FIG. 3 depicts a plan view of the substrate transfer mechanism 120 illustrating the motion of the end effector 208 about the body 202. The motion illustrated in FIG. 3 may be referred to as "polar" motion. In a rotational mode, the end effector 208 may be rotated about the body 202 of the substrate transfer mechanism 120 by rotating the shaft 204 while the elbow 214 maintains an angle 302 constant between the first strut 210 and the second strut 212. In the rotational mode, the end effector 208 is maintained at a constant radius from the centerline of the shaft 204. In a extension or retraction mode, the end effector 208 may be extended and retracted by rotating the shaft 204 while engaging a linkage (not shown) in the elbow 214 to increase or decrease the angle 302 between the first strut 210 and the second strut 212. For example, when the shaft 204 is rotated clockwise while the angle 302 is decreased, the end effector 208 moves towards the body 202 of the substrate transfer mechanism 120. In a combined mode, the rotational and extension/retraction modes are combined to produce a hybrid motion.

The end effector 208 generally includes a disk 304 and one or more orientation sensors 308 disposed thereon. The disk 304 is generally rotatably disposed on the end effector 208. The disk 304, which may be maintained in contact with or be actuated to contact the substrate disposed on the end effector 208, may be rotated so that an indicia 306 of the substrates orientation (i.e., a notch, flat or the like) may be rotated above the orientation sensor 308. The orientation sensor 308, which is coupled to the controller, provides a signal that is indicative of the indicia's position proximate the orientation sensor 308, thus establishing the substrate's orientation on the end effector 208. The disk 304 may include an optional vacuum port 334 disposed therein to retain the substrate to the disk 304.

In one embodiment, the end effector 208 generally includes a center portion 310 having a first tab 312, a second tab 314 and a third tab 316 extending therefrom. Each tab 312, 314, 316 has one of the substrate support seats 218 (individually shown as 318A, 318A and 318B) disposed thereon. Generally, the tabs 312, 314, 316 are orientated in so that the substrate 124 is supported by the seats 318A, 318B when disposed on the end effector 208 in a stable position that maintains the substrate 124 on the end effector 208 without falling during transport. As such, it is contemplated that the geometry of the end effector 208 is scaled to accommodate substrates of different diameters. Generally, one seat, preferably the seat 318A that is disposed on the first tab 312, is movable towards the center portion 310 to allow the substrate 124 to be gripped between the seats 318A, 318B, thereby centering the substrate on the end effector 208 and disk 304.

The first tab 312 generally couples the center portion 310 to the wrist 216 of the substrate transfer mechanism 120. In one embodiment, the first tab 312 includes an actuator, such as a pneumatic cylinder, solenoid or the like, coupled thereto. A plunger 322 of the is coupled to the seat 318A that is disposed on the first tab 312. The plunger 322, when urged by the actuator 308, moves the seat 318A inwardly toward the stationary seats 318B coupled to each of the second and third tabs 314, 316, thus gripping the substrate 124 therebetween.

The second tab 314 and the third tab 316 are disposed on the side of the center portion 310 opposite the first tab 312. Typically, the second tab 314 and the third tab 316 are disposed as mirror images to either side of an imaginary line defined between the first tab 312 and the center of the center portion 310.

In one embodiment, a substrate sensor 324 is disposed on the second tab 316 for detecting the proximate of an object 332 to the end effector 208. The sensor 324 may be an optical sensor. The sensor 324 may be used alone or in tandem with a reflector or receptor 326 that is disposed on the third tab 318. When the object 332 disrupts a beam, such as a light wave, passing between the sensor 324 and the receptor 326, a signal is generated by either the sensor 324 or receptor 326 indicating the presence of the object 332 therebetween. As the sensor 324 and receptor 326 are position on the second and third tabs 314, 316 outward of the substrate's perimeter when disposed on the end effector 208, the sensor 324 and receptor 326 may be utilized when the substrate 124 is disposed on the end effector 208. This configuration is particularly useful in detecting objects 332 such as substrates in the substrate storage cassette 130. Alternatively, other types of sensors (used alone or in tandem) that detect the presence of an object may be utilized in place of the sensor 324 and receptor 326, for example, proximately sensors, limit switches, optical sensors, pressure transducers and the like.

At least one orientation sensor 308 is typically disposed on one of the tabs 312, 314 or 316. The orientation sensor 308 is generally positioned at a radial distance from the center of the center portion 310 equal to the radius of the substrate for which the end effector 208 is designed to transfer. The sensor 308 is typically a proximately sensor that detects the presence of the substrate thereover. Alternatively, the orientation sensor 308 may be a through beam sensor, a reflective sensor or a CCD camera. Such sensors are generally available from a number of commercial sources such as Keyence Corporation, of Woodcliff Lake, N.J. The orientation sensor 308 provides a signal indicative of the passing of the indicia 306 thereover as the substrate 124 is rotated. For example, the sensor 308 may have an optical detection means that provides a signal (which may be configured to be no signal) in response to the reflectivity of the substrate when disposed proximate thereto. Since the indicia 306 provides a discontinuity in the reflectivity seen by the sensor 308, the indicia 306 passing over the sensor 308 causes a change in signal level. The difference in signals provided by the sensor 308 in response to the discontinuity (i.e., the indicia 306) passing over the sensor 308 is indicative of the substrate's orientation. The signal information is provided to the controller which logs the event in relation to the angular position of the disk 304, thus providing a reference of the substrate's orientation for use when positioning the substrate 124 in process chambers 108 which require a particular orientation during processing.

Alternatively, more than one orientation sensor 308 may be disposed on the end effector 208. Since the indicia 306 typically is disposed in a single location, having multiple sensors 308 disposed on the end effector 208 may reduce the time required for the indicia 306 to rotate over one of the orientation sensors 308. For example, a second orientation sensor 328 may be disposed on the end effector 208. In one embodiment, the second orientation sensor 328 is disposed on the first tab 312. Optionally, additional orientation sensors, such as a third orientation sensor 330 disposed on the third tab 316, may be utilized. Any one of the sensors 308, 328 and 330 may be elongated a radial orientation relative to the center of the disk 304 so that the indicia 306 may be detected on substrates that are disposed off-center on the disk 304.

Optionally, the orientation sensor 308 may be disposed remotely to the end effector 208. For example, one or more sensors 308 may be disposed another component of the substrate transfer mechanism 120, in the substrate storage cassette 130, in the factory interface 102, in the transfer chamber 104, in the load lock chamber 106, in the one or more process chambers 108, in the various ports or other locations within the system 100 where the indicia 306 disposed on the substrate 124 may be viewed.

Figure 4:
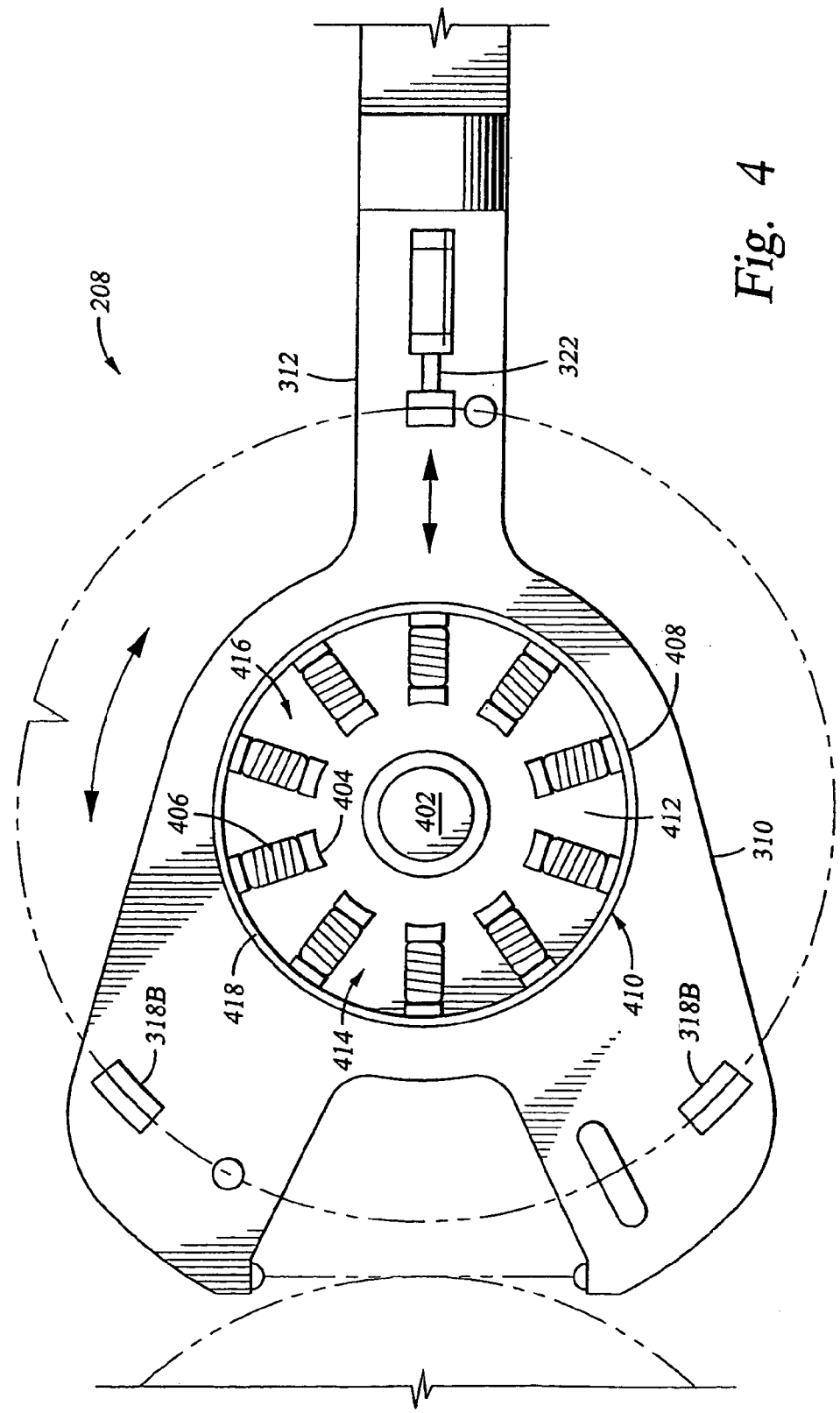
FIG. 4 depicts a plan view of the end effector of FIG. 3 illustrating a motor assembly.

FIGS. 4 and 5 depict the end effector 208 with the disk 304 removed to show a motor 410. A hub 402 is centrally disposed on the center portion 310 of the end effector 208. The disk 304 typically includes a flange 502 that at least partially circumscribes the hub 402. A bearing 504 may be disposed between the flange 502 and hub 402 to enhance the rotation to the disk 304. An annular pocket 414 circumscribes the hub 402 and extends into the center portion 310. A pocket bottom 412 generally extends between an outer wall 408 and the hub 402 thereby defining the pocket 414.

The motor 410 is disposed in the pocket 414 of the end effector 208. The motor 410 generally comprises a casing 418 that is disposed proximate the outer wall 408 and includes a plurality of armatures 416 extending inwardly therefrom. Each armature 416 includes a core 404 having a circumscribing conductive winding 406. The windings 406 of alternating armatures 416 are electrically coupled through the casing 418.

The motor 410 additionally includes a plurality of permanent magnets 506 are disposed on an outer surface 508 of the flange 502. The magnets 506 may be disposed on an inner race of the motor 410 (not shown) that is press-fit or adhered to the flange 502 of the disk 304. As the windings 406 are energized, the magnets 506 are urged in a rotary motion that causes the disk 304 to rotate. The magnets 506 circumscribe the flange 502 and are generally arranged in alternating polarity. As the controller (or other power source) energizes the winding 406 with an alternating current, the windings 406 alternately attract and repel magnets 506 having a given polarity as to cause the disk 304 to rotate on the hub 402 in a conventional fashion. Alternatively, the disk 304 may be rotated through other means, for example, a belt, gear assembly or drive shaft coupled to a motor or solenoid positioned on or remote to the end effector 206.

Optionally, an encoder 510 may be coupled to the end effector 208 proximate the disk 304. The encoder 510 is coupled to the controller 150 to provide closed-loop information regarding the angular position of the disk 304.

FIG. 6 depicts another embodiment of an end effector 600. The end effector 600 is generally substantially similar to the end effector 208 described above except that the end effector 600 includes an actuator 602 disposed thereon for elevating the substrate 124 relative to the end effector 600. In one embodiment, a hub 604 centrally disposed in the end effector 600 at least partially houses the actuator 602. The actuator 602, which may be a solenoid, may be actuated to lift the substrate 124 clear of the seats 218 as shown. In the lifted position, the substrate 124 may be rotated by the disk 304 without touching the seats 218, thus minimizing particle generation and the chance of scratching of the substrate during rotation. Other means for actuating the substrate normally to the end effector 600 include lead screws, pneumatic cylinders, hydraulic cylinders, electromagnetic actuators, cams, fluid jets and the like. A substrate 124' depicted in phantom is shown in a lowered position supported by the seats 218.

FIGS. 1 and 3 may be referred to during the following description of one mode of operation. Generally, the substrate transfer mechanism 120 moves proximate one of the substrate storage cassettes 130. Using the substrate sensor 324 and receptor 326, the presence of a substrate within the storage cassette 130 is confirmed before gripping the substrate. The end effector 208 of the transfer mechanism 120 then extends into the cassette 130 to retrieve the substrate. The substrate is gripped by moving the seat 318A towards the stationary seat 318B. The end effector 130 is then retracted and the substrate is moved to the load lock 106.

Typically during movement of the substrate between the cassette 130 and load lock 106, the first seat 318A is moved slightly outward to relax the grip on the substrate. Once the substrate can rotate across the seats 318A, 318B, the motor assembly 410 is energized to rotate the disk 304. As the disk 304 supporting the substrate rotates, the indicia 306 passes over the orientation sensor 308, indicating the angular orientation of the substrate. The controller stores the substrate's orientation information in the controller's memory for use when positioning the substrate in those process chambers 108 that require substrate orientation. Alternatively, the orientation of the substrate occurs while the end effector 208 is stationary. In another mode of operation, once the orientation of the substrate is determined, the substrate is rotated to place the indicia 306 in a predefined orientation relative to the end effector 208.

As stated above, the substrate transfer mechanism 120 having the capability for orientating the substrate is not limited to the illustrative embodiment described above. For example, a robot having an end effector that includes a rotating disk and at least one sensor may be utilized outside of a vacuum environment or other chamber.

Figure 7:
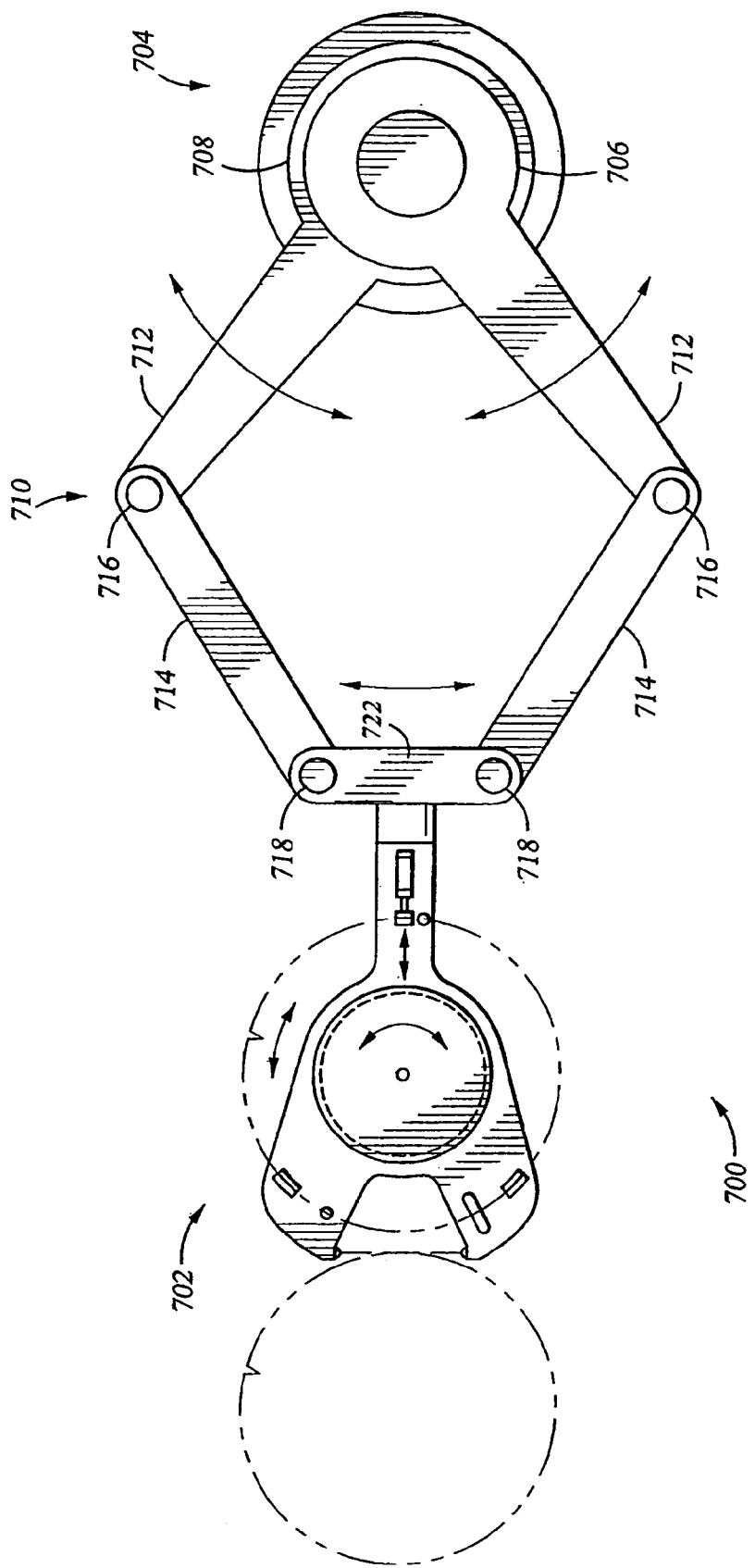
FIG. 7 depicts another embodiment of a substrate transfer mechanism.

Another example of a substrate transfer mechanism 700 is depicted in FIG. 7. The substrate transfer mechanism 700 generally includes an end effector 702 coupled to a frog-legged robot 704. The end effector 702 is substantially similar to the end effector 208 described above. The robot 704 includes a pair of concentric drive motors 706, 708 regulated by the controller. The robot 704 includes a pair of robot arms 710 each including a first strut 712 rigidly connected to a respective drive 706, 708. A second strut 714 of the robot arm 710 is pivotally connected to the first strut 712 by an elbow pivot 716 and by a wrist pivot 718 to a common rigid connecting member 722. The connecting member 722 is coupled to the end effector 702. The structure of the struts 712, 714 and pivots 716, 718 form a "frog-leg" linkage that is actuated in a conventional manner to rotate, extend and retract the end effector 702. The substrate transfer mechanism 700 may be utilized in any number of locations requiring transfer and/or orientation of the substrate. Additionally, the substrate transfer mechanism 700 may include more than one end effector 702, for example, a second end effector coupled to the robot 704 or to a second robot mounted concentrically to the robot 704 (second end effector and second robot not shown). One location where the substrate transfer mechanism 700 may be utilized in dual end effector configuration is in place of one or both of the transfer robots 112A, 112B disposed in the transfer chamber 104 of FIG. 1. An example of a robot that may be modified to benefit from the invention is described in the previously incorporated U.S. patent application Ser. No. 09/272,658.

Although the teachings of the present invention that have been shown and described in detail herein, those skilled in the art can readily devise other varied embodiments that still incorporate the teachings and do not depart from the scope and spirit of the invention.

What is claimed is:

1. Apparatus for transferring a substrate comprising:
   a chamber;
   a robot disposed in the chamber and having at least one end effector adapted to support the substrate;
   at least one sensor disposed on the end effector, the sensor adapted to detect an inidicia of orientation of the substrate;
   a disk coupled to the end effector;
   a motor coupled between the disk and the end effector, wherein the motor rotates the substrate disposed on the disk relative to the end effector; and
   an actuator coupled to the disk, the actuator for elevating the disk relative to the end effector.

2. The apparatus of claim 1, wherein the chamber is a vacuum chamber.

3. The apparatus of claim 1 further comprising one or more substrate storage cassettes coupled to the chamber.

* * * * *